United States Patent [19]

Lewis et al.

[11] Patent Number: 4,951,114
[45] Date of Patent: Aug. 21, 1990

[54] COMPLEMENTARY METAL ELECTRODE SEMICONDUCTOR DEVICE

[75] Inventors: Edward T. Lewis, Sudbury, Mass.; Dale L. Montrone, Londonderry, N.H.

[73] Assignee: Raytheon Company, Lexington, Mass.

[21] Appl. No.: 279,735

[22] Filed: Dec. 5, 1988

[51] Int. Cl.⁵ .............................................. H01L 29/80
[52] U.S. Cl. ....................................... 357/42; 357/15; 357/23.12; 357/22
[58] Field of Search ............... 357/15, 42, 23.12, 22 A, 357/22 MD

[56] References Cited

FOREIGN PATENT DOCUMENTS 58-148451 9/1983 Japan .
62-76680 4/1987 Japan .

OTHER PUBLICATIONS

Glasser and Dobberpuhl, "The Design and Analysis of VLSI Circuits", Addison-Wesley Publish. Co., Reading, Mass. 1985, pp. 226.
Sze, "Physics of Semiconductor Devices", John Wiley & Sons, New York, 1981, pp. 293-297.

Primary Examiner—Andrew J. James
Assistant Examiner—David Soltz
Attorney, Agent, or Firm—Walter F. Dawson; Richard M. Sharkansky

[57] ABSTRACT

A semiconductor device referred to as complementary metal electrode semiconductor (CMES) has p-type and n-type silicon MESFETs interconnected on a substrate with an n-type barrier enhancement implanted into the p-channel of the p-type MESFET. The structure and method of fabrication are provided for forming a CMES logic inverter which has characteristics of very low power, low voltage, low noise and high speed.

4 Claims, 3 Drawing Sheets

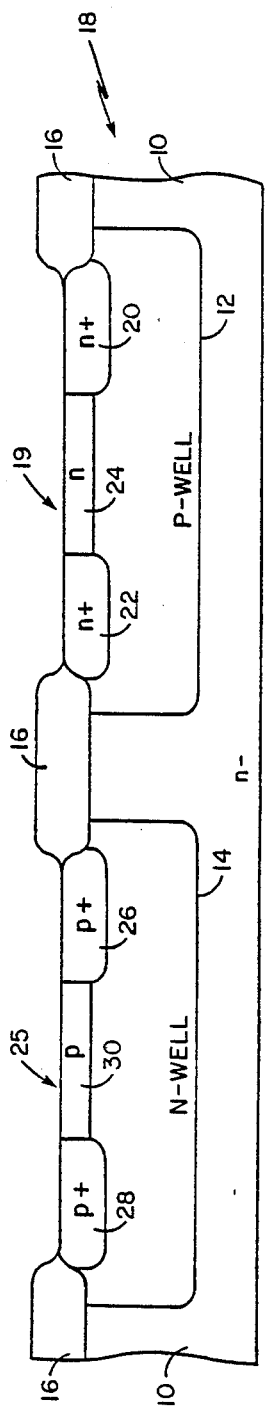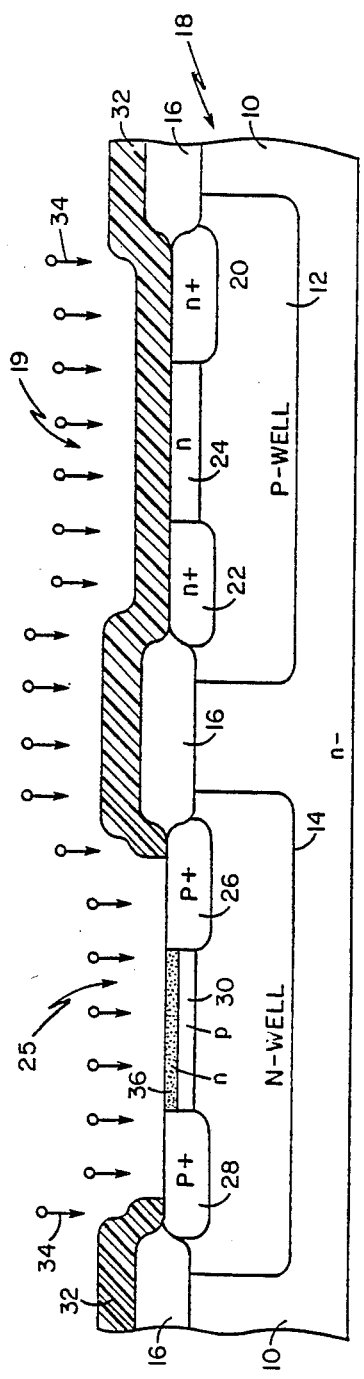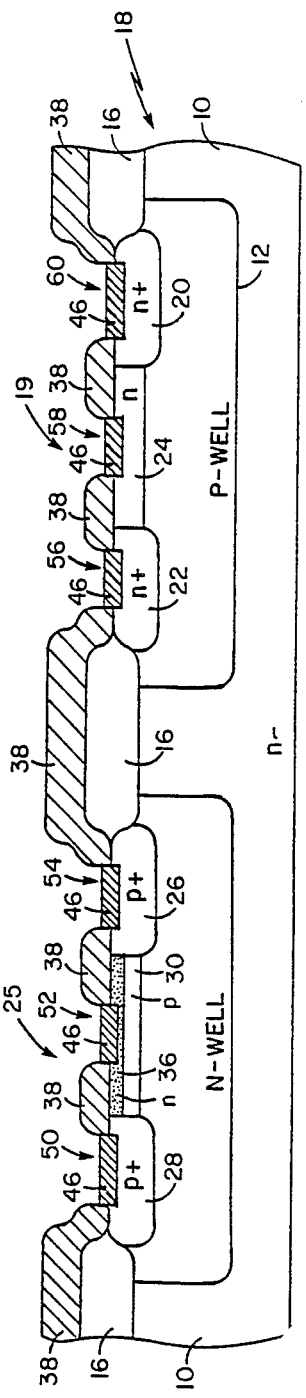

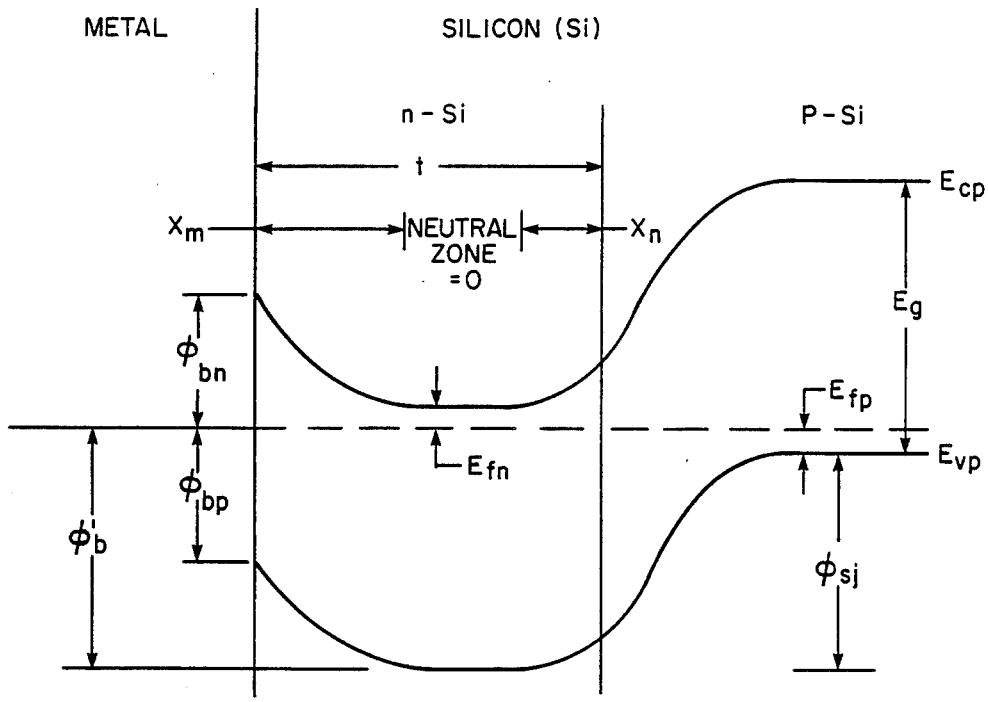

where:

$E_{cp}$ = Conduction band energy in the P-silicon $E_{vp}$ = Valence band energy in the P-silicon $\phi_{bn}$ = Schottky Barrier for Implanted n-Layer $\phi_b'$ = Enhanced Schottky Barrier $\phi_{sj}$ = P-n Junction Energy (or New Silicon Surface Energy)

$\phi_{sj} = \dfrac{kT}{q} \ln \dfrac{N_a N_d}{n_i^2}$ $\phi_{bp}$ = Unenhanced P-Schottky Barrier $\phi_{bp} + \phi_{bn} = E_g$ (Energy band gap of silicon)

FIG. 3

COMPLEMENTARY METAL ELECTRODE SEMICONDUCTOR DEVICE

BACKGROUND OF THE INVENTION

This invention relates generally to a semiconductor structure manufacturing method and more particularly to a complementary metal electrode semiconductor (CMES) device.

As is known in the art relatively low power, high speed, digital logic circuits have been designed using complementary MOSFET (metal oxide semiconductor field effect transistor) technology. The complementary MOSFET (also referred to as CMOS) is formed by interconnecting n-channel and p-channel field effect transistors on a single crystal substrate which results in a CMOS device with very low static power dissipation.

In general, when complementary MOSFETs are used to perform logic operations, power is only dissipated when operating in the "active" mode. The "active" mode occurs when the logic inputs are being continually exercised at a frequency (f) producing a proper logic output at the same frequency. The active power dissipation is proportional to this frequency (f), the square of the logic voltage, $V^2$, and the active capacitance, C, which is charged and discharged. Thus, $P \alpha CV^2f$, and the total "active" power dissipation is proportional to the number of these logic functions being exercised at a particular operating frequency.

However, with the advent of very large scale integrated circuits (VLSI) using 1.0 micron process technology and the next generation expectations of submicron process technology, the resulting high density integration of high speed circuits provides semiconductor devices having undesirable active power dissipations and establishes the need for a much lower power, high speed semiconductor technology. As can be seen in the power relation, the power dissipation is directly proportional to the square of the logic voltage. If this can be reduced by a factor of 5 to 10, then the resulting active power dissipation would be reduced by a factor of 25 to 100. A complementary MESFET device can provide this power reduction if both the n-MESFET and the p-MESFET are both operating as enhancement mode devices.

An n-channel MESFET is formed by creating a Schottky barrier on n-type silicon between two heavily doped regions (n+) called the source and drain. A p-channel MESFET is formed by creating a Schottky barrier on p-type silicon between two heavily doped regions (p+), similarly called the source and drain. For the most efficient operation of such Schottky barriers in controlling the flow of charge between respective sources and drains, it is required that they have the highest "barrier" energies possible. This is not achievable using conventional techniques for forming n-channel and p-channel MESFETS on the same silicon wafer.

SUMMARY OF THE INVENTION

In accordance with the present invention, a semiconductor device is provided comprising an enhancement mode n-channel field effect transistor having a metal electrode for coupling to a first control signal, an enhancement mode p-channel field effect transistor having a metal electrode for coupling to a second control signal, said p-channel field effect transistor having an n-type barrier enhancement implant, and means for serially coupling the enhancement mode n-channel field effect transistor to the enhancement mode p-channel field effect transistor. The n-type barrier enhancement is implanted into a shallow portion of the p-channel of the p-channel enhancement mode field effect transistor to provide an enhanced forward Schottky voltage. The semiconductor device further comprises contact means for interconnecting the first control signal and the second control signal to form a CMES logic inverter device.

In accordance with the present invention, a complementary metal electrode semiconductor (CMES) inverter logic device is provided comprising a twin-well MESFET structure on a silicon substrate having a p-channel field effect transistor in an n-well and an n-channel field effect transistor in a p-well, an n-type barrier enhancement implanted into a shallow portion of the p-channel of the p-channel field effect transistor, means for coupling a drain of the p-channel field effect transistor to a drain of the n-channel field effect transistor, and contact means for coupling a metal electrode gate of the p-channel field effect transistor to a metal electrode gate of the n-channel field effect transistor.

In accordance with a further feature of the invention, a method is provided for a barrier enhanced semiconductor structure comprising the steps of forming a twin well MESFET structure on a silicon wafer having a p-channel FET in an n-well and an n-channel FET in a p-well, forming a window in a photoresist layer disposed over the surface of the twin well MESFET structure to expose the p-channel in the n-well, implanting an n-type barrier enhancement layer into the p-channel, removing the photoresist layer, disposing a layer of silicon dioxide over the surface of the wafer, forming a mask over the silicon dioxide layer having a plurality of windows, bringing an etchant into contact with portions of the silicon dioxide exposed by the windows formed in the mask to selectively remove the portions of the silicon dioxide layer exposed by such windows to expose contact areas to a source, drain and channel of the p-channel and the n-channel MESFETS, disposing a layer of platinum over the surface of the wafer, heating the silicon wafer such that a thin region of platinum silicide forms on the silicon areas exposed to the platinum, chemically removing residual platinum from the silicon dioxide layer, depositing a layer of metal over the wafer, and patterning the deposited layer of metal for providing circuit contact connections.

BRIEF DESCRIPTION OF THE DRAWINGS

Other and further features and advantages of the invention will become apparent in connection with the accompanying drawings wherein:

FIGS. 1A–1D are cross-sectional elevation views, somewhat distorted, of a complementary metal electrode semiconductor device according to the invention at various steps in the manufacture thereof;

FIG. 3 is an energy band diagram of an enhanced p-type Schottky barrier.

DESCRIPTION OF THE PREFERRED EMBODIMENTS

Figure 1D:
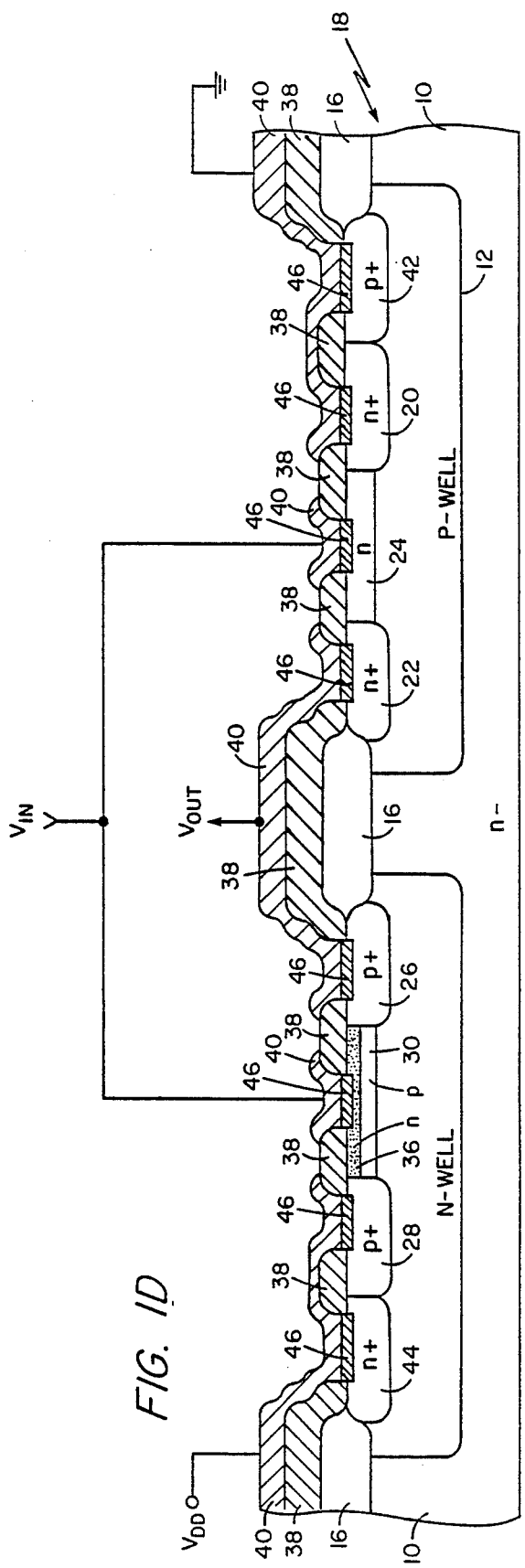

Referring now to FIGS. 1A to 1D the steps in forming a Complementary Metal Electrode Semiconductor (CMES) integrated circuit on a silicon wafer 18 are shown comprising a pair of enhancement mode metal electrode semiconductor field effect transistors (MESFETs) 19, 25 As indicated in FIG. 1A a lightly doped n-type (n-) conductivity silicon substrate 10 has a conventional twin-well MESFET structure comprising p-well 12 and n-well 14 with a normal n-channel 24 and p-channel 30 respectively known to one skilled in the art. Each field effect transistor 19, 25 is locally defined using locally oxidized silicon (LOCOS) 16 isolation. The silicon substrate 10 may also be lightly doped p-type instead of n-type.

Referring now to FIG. 1B, a layer of photoresist 32 is uniformly applied to the surface of the silicon wafer 18 shown in FIG. 1A. A pattern is defined in the photoresist layer 32 using conventional integrated circuit photolithographic techniques. As a result of this "patterning", the p-channel 30 area is exposed so that an n-type barrier enhancement layer 36 is created by placing the silicon wafer 18 (with the patterned photoresist) into an ion-implantation apparatus and implanting a shallow n-type region 36 on the p-channel 30 of the p-type MESFET 25. The photoresist layer 32 over the other regions of the silicon wafer 18 acts as a block to atoms 34 being implanted in the exposed p-channel 30 area Next, the photoresist layer 32 is removed in a conventional manner.

Referring now to FIG. 1C, following the implantation of the n-type barrier enhancement layer 36, a layer of silicon dioxide 38 is chemically vapor deposited over the entire surface of the silicon wafer 18. Then, using conventional photolithography, a pattern is defined followed by etching of the silicon dioxide to expose contact areas to a source 50, drain 54 and channel 52 of the p-channel transistor 25 and to a source 60, drain 56 and channel 58 of the n-channel transistor 19. A layer of platinum (Pt) (not shown) is deposited over the entire silicon wafer 18, and then the wafer 18 is heated so that a thin region of platinum silicide (PtSi) 46 is chemically formed only between the platinum and silicon areas; the platinum does not react with the patterned silicon dioxide layer 38. Next, the unreacted platinum is chemically removed yielding the wafer 18 as shown in FIG. 1C. The n-type barrier enhancement layer 36 in a p-type device overcomes the typical low voltage barrier energy of all p-type silicon Schottky barriers which typically are less than 0.5 electron volts (ev). The PtSi layer for n-type Schottky yields a barrier energy of approximately 0.85 ev. Therefore, the selective implantation of a shallow impurity layer of opposite conductivity from the host channel permits the selection of a higher barrier metal such as platinum silicide (PtSi) for the n-channel structure and then adjusting the p-channel barrier for matching to the high barrier energy of the n-type Schottky. This approach also allows the use of one metal for both n-type and p-type Schottky diodes as well as the source and drain contacts.

Figure 2:
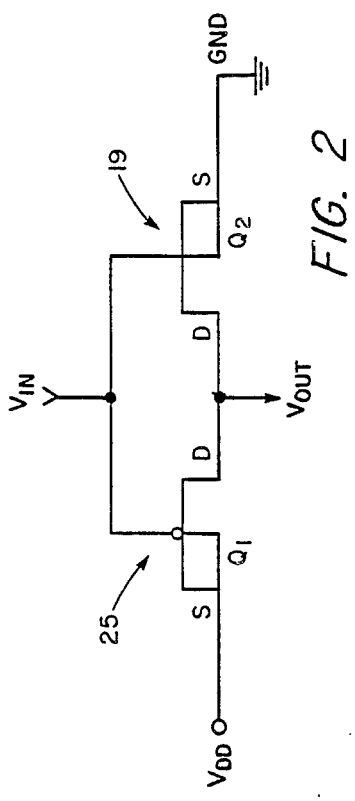
FIG. 2 is a schematic diagram of a CMES inverter logic device according to the invention.

Referring now to FIG. 1C, 1D and FIG. 2, a metal 40 (such as aluminum) is deposited and patterned on the silicon wafer 18 after the fabrication stage shown in FIG. 1C resulting in the wafer 18 illustrated by FIG. 1D which provides for contacts to enable the resulting inverter circuit to be inter-connected with other complementary MESFET circuits. FIG. 2 is a schematic representation of the CMES inverter of FIG. 1D showing the connections to $V_{DD}$, ground, $V_{in}$ and $V_{out}$ in order to have an operational CMES device. FIG. 1D shows for completeness the n+silicon 44 and the p+silicon 42 which are standard in MESFET transistors and normally formed during the fabrication stages shown in FIGS. 1A-1C but not shown here. They provide the means for direct electrical contact to their respective wells.

Referring now to FIG. 3, an energy band diagram of enhanced p-type Schottky barrier is shown for reference in determining the implant layer conditions and barrier enhancement. If the layer concentration is too high or too deep a neutral zone illustrated in FIG. 3 would exist in the implanted n-layer 36. Such a zone cannot be permitted to exist because it would create the equivalent of a Schottky diode in series with a p-n junction diode. Therefore, $Xm + Xn > t$ (implant layer depth)

where, $Xm$ = the space charge layer extending from the metal $Xn$ = the space charge layer extending from the junction for all conditions of bias. In this structure the depletion layer extending from the metal contact is an n-Si Schottky barrier. The maximum depletion depth is given by $$Xm = \left( \frac{2\epsilon_s(\phi_{bn} - E_{fn})}{qN_d} \right)^{\frac{1}{2}}$$

where, $\epsilon_s$ = Permittivity of silicon $\phi_{bn}$ = Schottky barrier height between metal and the silicon conduction band.

$E_{fn}$ = Fermi level in n-type silicon $N_d$ = Doping level in n-type silicon q = Charge of an electron The depletion width extending from the p-n junction into the n-layer is given by $$Xn = \left( \frac{2\epsilon_s N_a}{qN_d(N_d + N_a)} \phi_{sj} \right)^{\frac{1}{2}}$$

where, $N_a$ = Doping level in p-type silicon $\phi_{sj}$ = Barrier energy between the n-type and p-type silicon $$\phi_{sj} = \frac{kT}{q} \ln \frac{N_a N_d}{n_i^2}$$

k = Boltzmann Constant

T = Temperature in degrees K $n_i$ = Intrinsic carrier concentration of silicon

These conditions apply at zero gate bias. It is important to note that the maximum achievable Schottky barrier ($\phi_b'$) is given by $$\phi'_b = \phi_{sj} + E_{fp}$$

where, $E_{fp}$ = Fermi level in p-type silicon and is a function of the doping levels in the p and n regions only. Therefore, this order of magnitude barrier enhancement can be obtained independent of the initial Schottky barrier. For example, with PtSi as the Schottky barrier and letting $$N_d=10^{18}, N_a=5\times 10^{16}, \phi_{bn}=0.85\text{ev}, \phi_{sj}=0.86\text{ev}$$

Then:

Xm=315 angstroms

Xn=74 angstroms

Thus, an implant layer with an average concentration of $10^{18}$ donor atoms with a depth of approximately 400 angstroms yields an effective barrier height of $\phi_{sj}+E_{fp}=0.9$ ev. Of course, different doping and depth combinations may be used. In order to insure that the n-layer remains depleted under depletion mode operation a channel implant depth less than this maximum barrier height number should be used. This results in a slightly lower barrier enhancement than the maximum quantity calculated.

Referring now to FIG. 2, the CMES inverter logic device is shown according to the invention. It includes enhanced barrier MESFET devices 19, 25 arranged as the logic inverter and formed on the silicon substrate 18. As shown, the gate electrodes of transistors 19, 25 are connected to an input, $V_{IN}$ and the drain electrodes of transistors 19, 25 are connected to an output, $V_{OUT}$. The source electrode of $Q_1$ transistor 25 is connected to a $V_{DD}$ supply and the source electrode of transistor 19 is connected to ground, GND.

In operation, when a logic "0" (0 volts) is applied to the input $V_{IN}$, the Q2 n-MESFET 19 is non-conducting while the Q1 p-MESFET 25 is conducting (enhanced), charging the output $V_{OUT}$ to a logic "1" ($V_{DD}$). When a logic "1" ($V_{DD}$) is applied to the input $V_{IN}$, the Q2 n-MESFET 19 is conducting (enhanced) while the Q1 p-MESFET 25 is non-conducting, discharging the output $V_{OUT}$ to a logic "0" (0 volts). The $V_{DD}$ supply need only be on the order of 0.5 to 1.0 volt; exceeding this voltage range would forward bias the Schottky diodes unnecessarily.

This concludes the description of the preferred embodiment. However, many modifications and alterations will be obvious to one of ordinary skill in the art without departing from the spirit and scope of the inventive concept. Therefore, it is intended that the scope of this invention be limited only by the appended claims.

What is claimed is:

1. A semiconductor device comprising:
    an enhancement mode n-channel field effect transistor having a metal electrode for coupling to a first control signal;
    an enhancement mode p-channel field effect transistor having a metal electrode for coupling to a second control signal;
    an n-type barrier enhancement implanted into a shallow portion of the p-channel of said p-channel enhancement mode field effect transistor for providing an enhanced forward Schottky voltage; and
    means for serially coupling said enhancement mode n-channel field effect transistor to said enhancement mode p-channel field effect transistor.

2. The semiconductor device as recited in claim 1 wherein:
    said device comprises contact means for interconnecting said first control signal and said second control signal to form a complementary metal electrode semiconductor device.

3. The semiconductor device as recited in claim 1 wherein:
    said serially coupling means connects a drain of said p-channel field effect transistor to a drain of said n-channel field effect transistor.

4. A CMES inverter logic device comprising:
    a twin well MESFET structure on a silicon substrate having a p-channel field effect transistor in an n-well and an n-channel field effect transistor in a p-well;
    an n-type barrier enhancement implanted into a shallow portion of the p-channel of said p-channel field effect transistor for providing an enhanced forward Schottky voltage;
    means for coupling a drain of said p-channel field effect transistor to a drain of said n-channel field effect transistor; and
    contact means for coupling a metal electrode gate of said p-channel field effect transistor to a metal electrode gate of said n-channel field effect transistor.

* * * * *